United States Patent
Ding et al.

(10) Patent No.: US 7,622,239 B2
(45) Date of Patent: Nov. 24, 2009

(54) MICRO-PATTERNED $SIO_2/TIO_2$ FILMS THROUGH PHOTO AND CHEMICAL REACTIONS

(75) Inventors: Xiaoling Ding, St. Petersburg, FL (US); David P. Fries, St. Petersburg, FL (US)

(73) Assignee: University of South Florida, Tampa, FL (US)

( * ) Notice: Subject to any disclaimer, the term of this patent is extended or adjusted under 35 U.S.C. 154(b) by 575 days.

(21) Appl. No.: 11/539,987

(22) Filed: Oct. 10, 2006

(65) Prior Publication Data

US 2007/0184358 A1  Aug. 9, 2007

Related U.S. Application Data

(60) Provisional application No. 60/724,965, filed on Oct. 7, 2005.

(51) Int. Cl.
*G03F 7/00* (2006.01)
(52) U.S. Cl. .............. 430/269; 430/5; 430/322
(58) Field of Classification Search ........... 430/5, 430/269, 322
See application file for complete search history.

(56) References Cited

U.S. PATENT DOCUMENTS 6,796,143 B2 * 9/2004 Clasen et al. ............. 65/17.3

OTHER PUBLICATIONS

Bermudez, V.Z., Carlos, L.D., Alcacer, L., 1999. Chem. Mater. 11, 569.
Prado, A.G.S., Miranda, B.S., Dias, J.A., 2004,. Colloids and Surface A: Physiochem. Eng. Aspects, 242, 137.
Saito, K., Uchiyama, Y., and Abe, K., 2003. Mater. Sci. Semicond. Process, 6, 363.
Takeda, Y., Kishimoto, N., 2003. Nucl. Meth. B, 206, 620.
Nishizawa, J., Kurabayashi, T., Kanamoto, K., Yoshida, T., and Oizumi, T., 2003. Mater. Sci. Semicond. Process, 6, 363.
He., L.N. and Xu, J., 2003. Vacuum, 68, 197.
Tohge, N., Zhao, G., Chiba, F., 1999. Thin Solid Films, 351, 85.
Dove, P.M. and Rimstidt, J.D., 1994. In: Heaney, P.J., Prewitt, C.T. and Gibbs, G.V. (Eds.), Silica—Physical Behavior, Geochemistry and Materials Applications. Reviews in Mineralogy, 29. Mineralogic Society of America. 259.
Jiang, X., Wang, T., and Wang, Y., 2004. Colloids and Surfaces A: Physiochem. Eng. Aspects, 234, 9.
Iler, R.K , 1979. In: The Chemistry of Silica, solubility, Polymerization, Colloid and Surface Properties, and biochemistry. John Wiley & Sons.

* cited by examiner

*Primary Examiner*—Thorl Chea
(74) *Attorney, Agent, or Firm*—Anton J. Hopen; Smith & Hopen, P.A.

(57) ABSTRACT

A method for making a patterned $SiO_2$ films over $TiO_2$ ($SiO_2/TiO_2$) under ambient atmospheric conditions, including room temperature, through photo and chemical reactions. The method is simple, convenient and can be performed in a short period of time, typically less than two hours. The patterned $TiO_2$ film is fabricated through photo-irradiation of a photosensitive organic-titanium film using a mask. Silica particles are generated from silicate solution by adjusting pH values to 10 to 8 with hydrochloric acid. The pre-deposited $TiO_2$ film has a strong attraction for the $SiO_2$ particles, leading to the instant formation of $SiO_2$ film over the $TiO_2$ film. The silica films are also amino-silylated with 3-aminopropyltriethoxysilane toward applications such as patternable, location-specific silica-based separation and purification.

20 Claims, 3 Drawing Sheets

MICRO-PATTERNED SIO$_2$/TIO$_2$ FILMS THROUGH PHOTO AND CHEMICAL REACTIONS

CROSS REFERENCE TO RELATED APPLICATIONS

This application claims priority to U.S. provisional patent application No. 60/724,965, entitled: "Micro-Patterned SiO2/TiO2 Films through Simple Photo and Chemical Reactions," filed Oct. 7, 2005, by the same inventors, the contents of which are herein incorporated by reference.

STATEMENT OF GOVERNMENT INTEREST

This invention was made with U.S. government support under grant No. DASG60-00-C-0089 awarded by the U.S. Army Space and Missile Defense Command. The U.S. government has certain rights in the invention.

FIELD OF INVENTION

This invention relates to patterned silica films. More specifically, this invention relates to silica films created through attraction silica solvent to pre-deposited, patterned titania films.

BACKGROUND OF THE INVENTION

Silica gel is a core substrate for creating functionalized surfaces for separation sciences. Additionally, silica enables and enhances the chemical and thermal stability of the ligands attached to its surface. [Bermudez, V. Z., et al., 1999. Chem. Mater. 11, 569; Prado. A. G. S., Miranda, B. S., Dias, J. A. 2004. Colloids and Surface A: Physlcochem. Eng. Aspects, 242, 137.] The active silanol groups on silica gel surface can react with organosilyl groups which contain the desired functional groups. This creates a variety of inorganic—organic hybrid surfaces which exhibit practical advantages such as structural stability, swelling behavior, thermal properties, accessibility of reactive centers, and insolubility in water and organic solvents. These hybrids have been widely applied in heterogeneous catalysis, metal ion and pesticide preconcentration, ion exchange, separation of metal ions, stationary phases for chromatography, biotechnology, and in controlled release pesticides.

Silica is also a very important dielectric material, which has been widely used as a gate insulator and an interlayer insulator between metal wiring layers of semi-conductor or thin-film transistor displays and other related applications. [Saito, K., et al. 2003, Thin Solid Films, 430, 287.] Furthermore, with the embedding of metal nano-particles (e.g., Ag, Cu), the potential applications of SiO$_2$ as an insulator in non-linear optical systems are attractive for future ultrafast networks and circuits ahead of semiconductor devices. [Takeda. Y., Kishimoto, N., 2003 Nucl. Instr. Meth. B, 206, 620.]

Recent technological advances in silicon processing allow small-scale fabrication of high-speed devices. As the size of the silicon device is scaled down, the device performance is limited by the fabrication processes of the gate structure. Therefore, a totally low-temperature process for the gate dielectric formation and post-gate process with no degradation of the fine doping profile or the gate stack is important for Si device fabrication. [Nishizawa, J., Kurabayashi, T., Kanamoto, K., Yoshida, T., and Oizumi, T., 2003. Mater. Sci. Semicond. Process, 6, 363.] However, current methods to synthesize/generate Si0$_2$ thin films have many disadvantages including (1) that the methods are time consuming, (2) the need for complex instrumentation, (3) the requirement for catalysts and (4) the harsh working conditions such as high temperature, argon environments [He, L. N and Xu, J., 2003 Vacuum, 68, 197] and operation under vacuum. In addition, some of the approaches can cause oxygen-originated damage due to use of plasma. We have developed a quick and simple method to make patterned Si0$_2$/Ti0$_2$ thin films through convenient photo and chemical reactions under ambient atmosphere and room temperature. The cost is low and the process approach is environmentally benign.

SUMMARY OF INVENTION

The invention includes a quick and simple method to make patterned SiO$_2$/TiO$_2$ thin films through convenient photo and chemical reactions under ambient atmosphere and room temperature. This low-temperature and non-oxygen based approach enables a non-damaging process for fabrication of micro-structures, and may reduce or eliminate the amount of change in the doping profile and defect density. In addition, surface modification of silica films were also achieved with potential applications in protein immobilization and purification.

The present invention provides a method of producing a patterned silica film. The method includes the steps of providing a patterned titania film, contacting the titania film with a silicate solution having a pH in the range of about 8 to about 10, whereby silica is absorbed on the surface of the patterned titania film by adherence to the titania on the film thus adopting the pattern of titania on the film and removing excess silica from the contacted titania film. In certain aspects of the invention the method includes the step of derivatizing the silica surface by silylation. The silylation can be an aminosilylation. In certain aspects of the invention the contacting step is performed under substantially continuous motion of the silicate solution. The motion of the silicate solution facilitates the deposition of the silica on the surface of the film. In certain aspects of the invention the excess silica is removed by rinsing with water followed by rinsing with alcohol. This rinsing can be further followed by rinsing with acetone. The alcohol used in the rinsing can be ethanol. In certain aspects of the invention the silicate solution includes about 1.4% to about 2.8% NaOH and about 2.7% to about 5.4% SiO$_2$. The pH of the sodium silicate solution can be adjusted by the addition of hydrochloric acid. In certain aspects of the invention the method further includes producing a patterned titania film including the steps of providing a photosensitive organic-titanium film and a mask, wherein the mask has a pattern of interest, applying the mask to the photosensitive organic-titanium film and exposing the photosensitive organic-titania film having the mask to photoirradiation to pattern the film. The exposure results in a patterned titania film having a pattern of interest.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Figure 1:
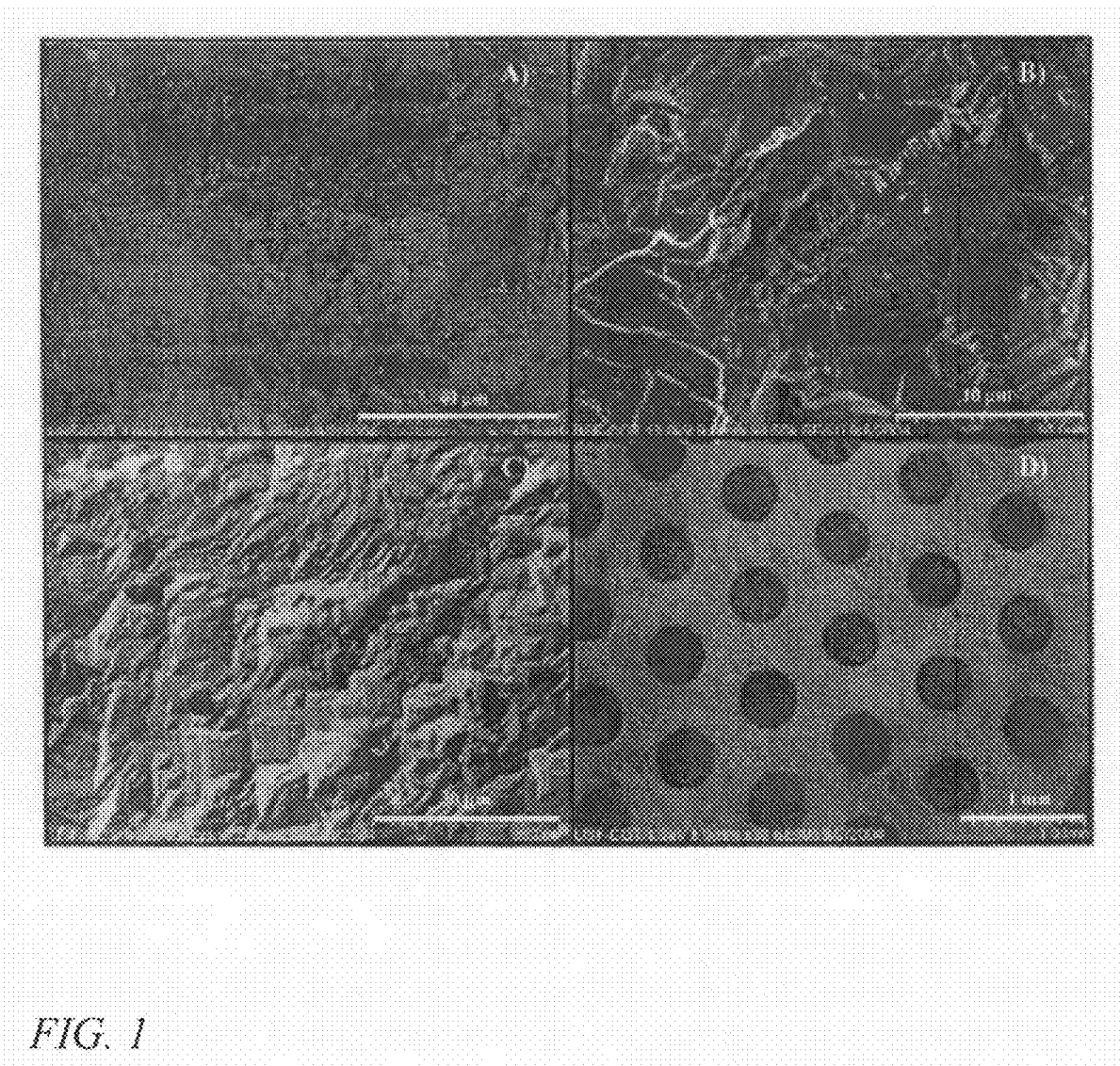
FIG. 1 is a set of scanning electron micrograph (SEM) images of the micropatterned films of (A) TiO$_2$; (B) SiO$_2$/TiO$_2$; (C) amino-silylated SiO$_2$/TiO$_2$; and (D) TiO$_2$ amino-silylated SiO$_2$/TiO$_2$.

A simple but inventive, non-etching related method is disclosed for making patterned $SiO_2$ films over $TiO_2$ ($SiO_2/TiO_2$) under room temperature and ambient atmosphere in a short period (typically, less than 2 hours) through convenient photo and chemical reactions. The patterned $TiO_2$ film is fabricated through photo-irradiation of a photosensitive organic-titanium film using a mask. $SiO_2$ particles are generated from silicate solution by adjusting pH values to 10 to 8 with HCl. The pre-deposited $TiO_2$ film has a strong attraction on $SiO_2$ particles, leading to the instant formation of $SiO_2$ film over the $TiO_2$ film. The silica films are also amino-silylated with 3-aminopropyltriethoxysilane toward applications such as patternable, location-specific silica-based separation and purification.

1. Photo-Sensitive Ti-Containing Gel Films

Ti-alkoxide derived from the reaction of titanium tert-butoxide and benzoylacetone and its hydrolysate are UV-sensitive to generate $TiO_2$. [Tohge N., Zhao, G., Chiba, F., 1999 *Thin Solid Films* 351, 85.] Micro-patterned $TiO_2$ is made as described by Tohge et al. with minor modification. Briefly, the stock solution of the reaction mixture (Ti solution) uses 10 mg of benzoylacetone, 20 μL of Ti(O-nBu)$_4$, 1 mL of $CH_3Cl$ and 100 μL of propylene glycol for enhancing viscosity and decreasing evaporation rate of the solution. Film deposition occurs via dispensing the Ti-solution on the top of the desired surfaces, with spinning at 1,500 rpm for 30 seconds to ensure the uniform distribution of organic substance, then soft bake the substrate on a hot plate (120° C.) for 10 seconds. The photosensitive film is exposed to UV (Mercury-Xenon lamp, 3500 mW/cm$^2$ at 365 nm) for 8 minutes and rinsed with ethanol or acetone to remove the Ti-solution residue. This is followed by rinsing with deionized water.

2. Formation of the Films of $SiO_2$ Over $TiO_2$ ($SiO_2/TiO_2$)

The solubility of $SiO_2$ is a function of pH (Eq. 1). Under alkali conditions (~pH>10), silica dissolves by the reversible reaction; and with pH decrease, silica precipitates from the alkali solution:

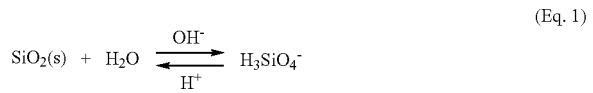
(Eq. 1)

When pH is from higher down to about 10, the precipitation of amorphous silica is dramatic with a sharp decreasing slope in dissolved concentration. The precipitation is slowed from pH 10 to 8 and then no further precipitation below pH 8. [Dove, P. M. and Rimstidt, J. D., 1994. In: Heaney, P. J., Prewitt, C. T. and Gibbs, G. V. (Eds.), *Silica—Physical Behavior, Geochemistry and Materials Applications. Reviews in Mineralogy*, 29. Mineralocal Society of America. 259.]

Freshly precipitated silica surface contains large amount of hydroxyl group, which can rapidly react with the hydroxyl group on the surface of hydrated titanium dioxide films ($TiO_2 \cdot nH_2O$):

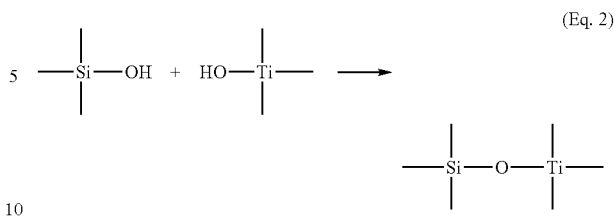
(Eq. 2)

This reaction was considered as approximated first-order reaction. [Jiang, X., Wang, T., and Wang Y., 2004. *Colloids and Surfaces A: Physicochem. Eng. Aspects*, 234, 9.]

Silica crystals were formed on the surface of pre-patterned $TiO_2$ film through attraction/adsorption. Sodium silicate (~14% NaOH and 27% $SiO_2$) was purchased from Sigma. The silicate solution was diluted 5-10 times before use. Hydrogen chloride acid (4N) was added drop by drop to the solution to adjust the pH to 8-10. The substrate with pre-patterned $TiO_2$ film was immersed into the silicate solution under continuous shaking. The reaction proceeds over the next three or more minutes. After rinsing with DI water, ethanol alcohol, and acetone, the $SiO_2/TiO_2$ films can be further modified for a variety of purposes.

3. Surface Modification of Silica Films

Surface modification of silica for attracting proteins, DNA and drug molecules can be achieved by derivatizing and coating the surface with a silane unit containing an amino group:

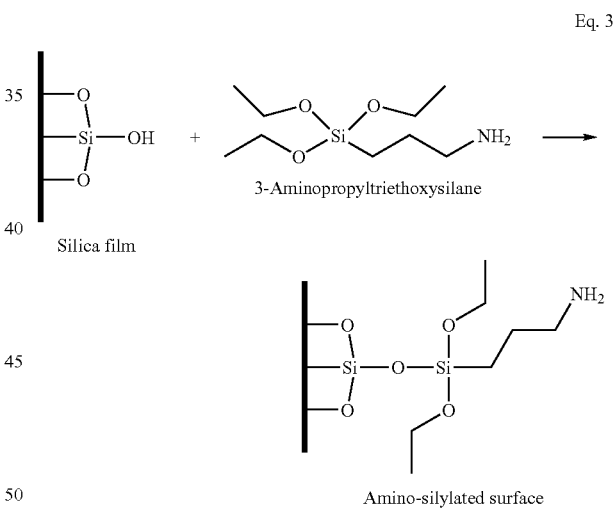
Eq. 3

The $SiO_2/TiO_2$ film was immersed in 2% of 3-Aminopropyltriethoxysilane in acetone for 30 seconds, then rinsed with acetone and dried in air.

Results

Figure 2A:
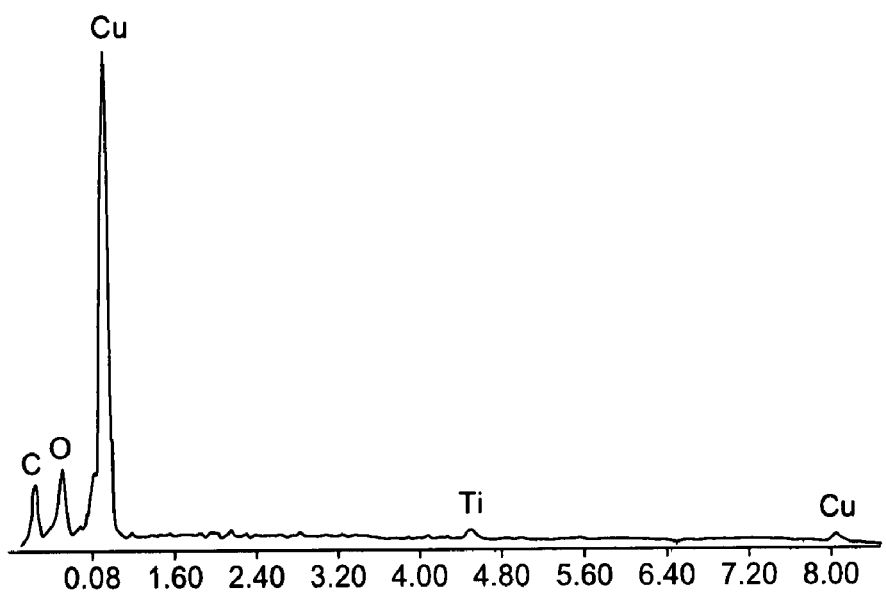
FIG. 2 is a series of graphs depicting the elemental analysis of the films of (A) TiO$_2$; (B) SiO$_2$/TiO$_2$; and (C) amino-silylated SiO$_2$/TiO$_2$ on a copper substrate under SEM-EDS.
Figure 2B:
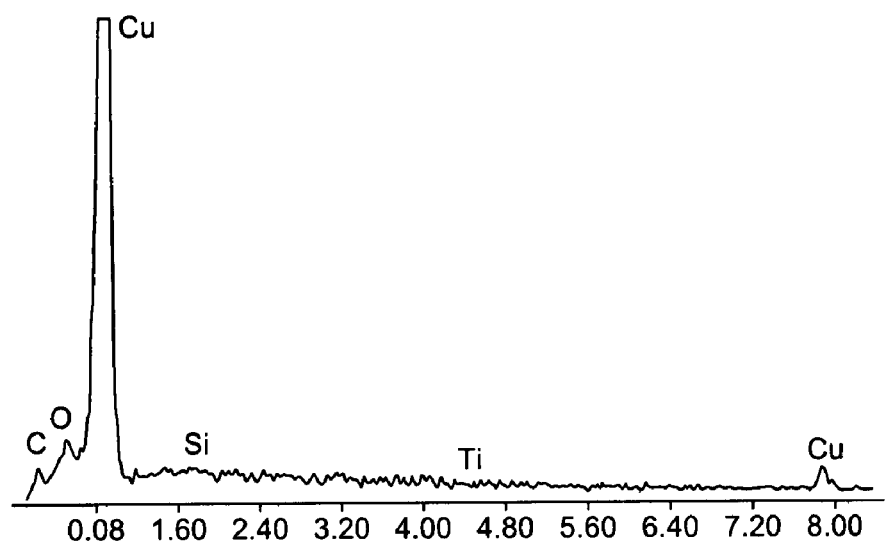
Figure 2C:
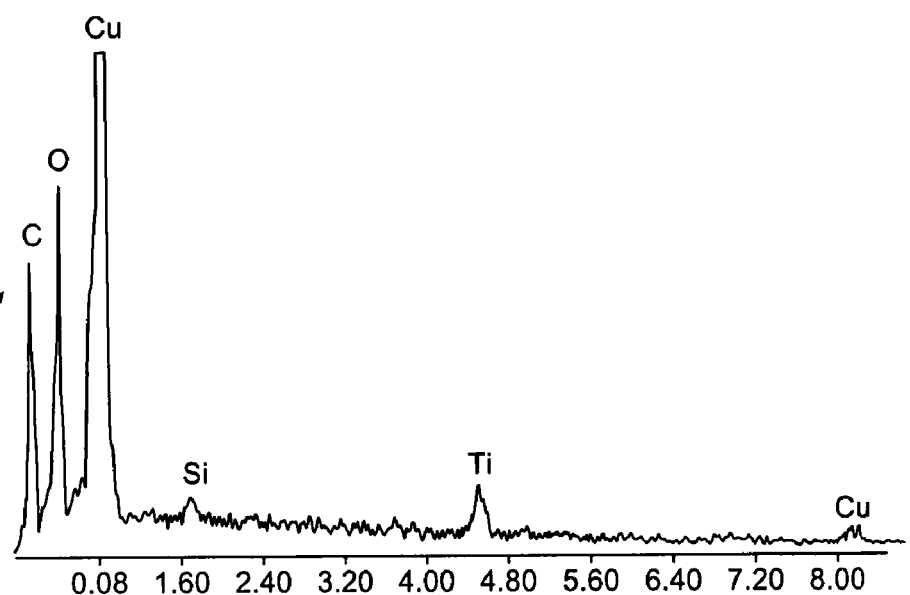

The $SiO_2/TiO_2$ films were examined using a field emission scanning electron microscope (SEM). SEM images of the fabricated films are presented in FIG. 1. $TiO_2$ particles sized about 10 to 20 nm (previous work) can be homogenously deposited on the substrate surfaces such as copper (FIG. 1A) and glass (not shown). The uneven surface (FIG. 1A) is due to rough background of the copper substrate. Silica crystals were grown on the pre-deposited $TiO_2$ film (FIG. 2B), and the silica surface was silylated (FIG. 1C). The depositions of $SiO_2$ onto $TiO_2$ film and amino-silane onto $SiO_2/TiO_2$ film were also indicted by the SEM—energy dispersive spectrometer (EDS)

technique (FIG. 2). The small carbon peak in the $TiO_2$ film showing in FIG. 2A is likely from the residues of the reaction precursors, which can be removed by heating the film at high temperature (~350 C) after rinsing with organic solvents. In this study, $TiO_2$ films were not heat-baked since hydrated titanium dioxide is desired to react with hydrated silica. However, such organic contaminates were further removed after the deposition of silica film (FIG. 2B) which required ethanol rising for removing pore water inside the silica gel/crystals and acetone washing for amino-silylating the silica surface. The significant increase in C peak showing in FIG. 2C indicated the deposition of organic material.

Figure 3:
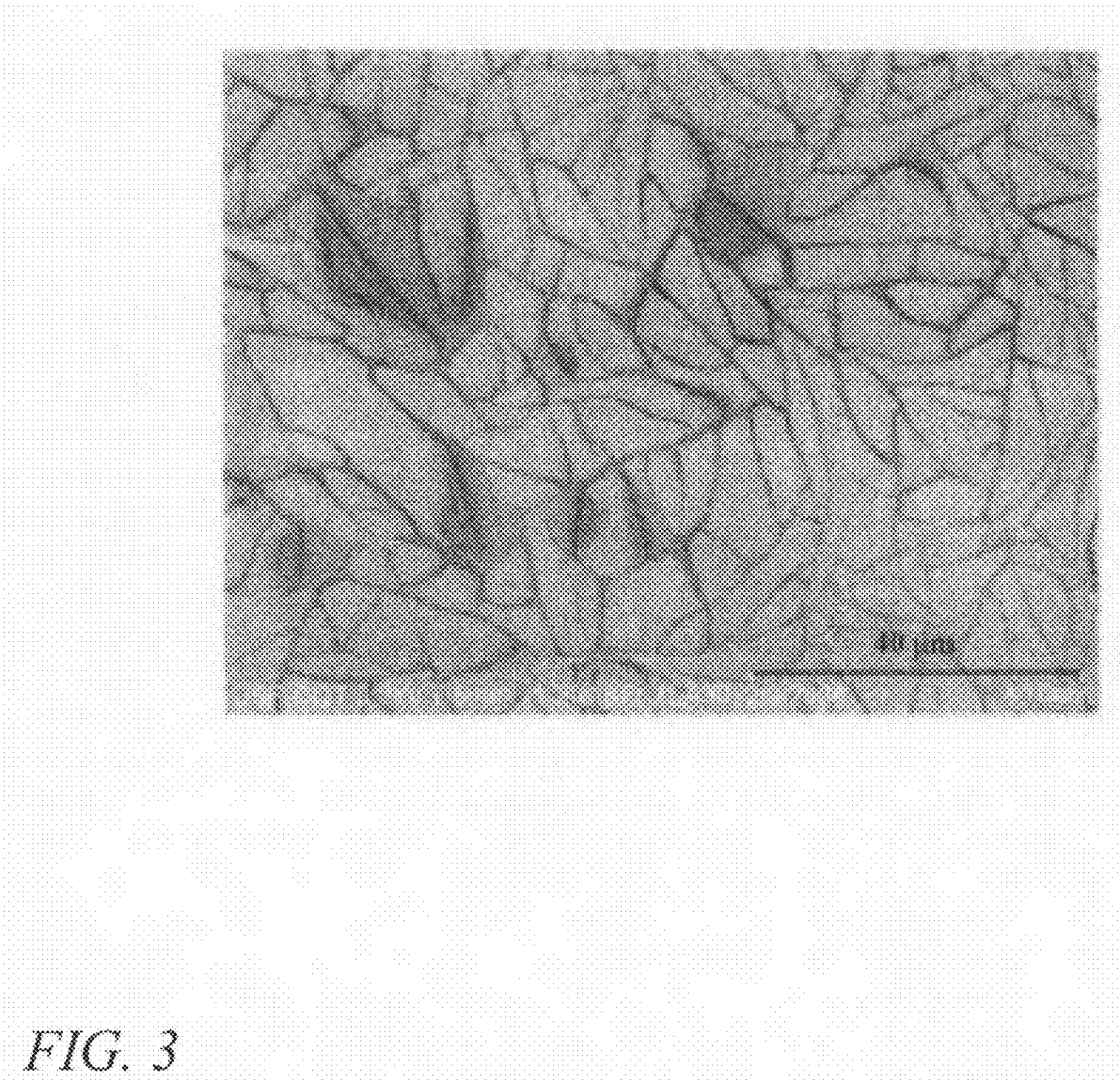
FIG. 3 is an SEM image of a SiO$_2$/TiO$_2$ film dried in air.

Precipitated silica is formed in aqueous medium as loose aggregates, in which the pores are filled with water. Since the silica gel consists of a 3-D network of particles or short chains of particles bonded rigidly together and since the silica particles themselves are inelastic, as the gel dries and structure shrinks owing to the surface tension of pore water, the network must fold or crumple, and this shrinkage is irreversible. FIG. 3 shows a cracked $SiO_2/TiO_2$ film which was directly dried in air without any treatment. To avoid such shrinkage, the liquid phase inside the silica gel should be replaced by a gaseous phase. [Tier, R. K., 1979. In: *The Chemistry of Silica, Solubility, Polymerization, Colloid and Surface Properties, and biochemistry*. John Wiley & Sons.] Alcohol was used to replace pore water because it has a low surface tension and evaporates at ordinary temperature. Such alcohol-treated gel structurally resembles the original silica films. When FIG. 1B is compared to FIG. 3, it can be seen that the silica film did not crack, and the following organic deposition further smoothed the surface (FIG. 1C).

A micro-patterned $SiO_2/TiO_2$ film was also produced (FIG. 1D) under room temperature and ambient atmosphere in a short period. This fabrication process provides a simple approach for applying silica as a dielectric material in semiconductor devices in micro-electro-mechanical system (MEMS) designs and development and as a substrate material for creating patterned, functionalized surfaces. Further developments for these applications are being pursued.

The disclosure of all publications cited above are expressly incorporated herein by reference, each in its entirety, to the same extent as if each were incorporated by reference individually.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween. Now that the invention has been described,

What is claimed is:

1. A method of producing a patterned silica film, comprising the steps of:
    providing a patterned titania film;
    contacting the titania film with a silicate solution having a pH in the range of about 8 to about 10, whereby silica is absorbed on the surface of the patterned titania film by adherence to the titania on the film thus adopting the pattern of titania on the film; and
    removing excess silica from the contacted titania film.

2. The method according to claim 1, further comprising the step of derivatizing the silica surface by silylation.

3. The method according to claim 2, wherein the silylation is an aminosilylation.

4. The method according to claim 1, wherein the contacting step is performed under substantially continuous motion of the silicate solution, whereby the motion facilitates the deposition of the silica on the surface of the film.

5. The method according to claim 1, further comprising the steps of removing the excess silica by rinsing with water, followed by rinsing with alcohol.

6. The method according to claim 5, further comprising the step of rinsing with acetone following the alcohol rinse.

7. The method according to claim 5, wherein the alcohol is ethanol.

8. The method according to claim 1, wherein the silicate solution comprises about 1.4% to about 2.8% NaOH and about 2.7% to about 5.4% $SiO_2$.

9. The method according to claim 8, wherein the pH of the sodium silicate solution is adjusted by the addition of hydrochloric acid.

10. The method according to claim 1, further comprising the steps of removing the excess silica by rinsing with water, followed by rinsing with alcohol, followed by rinsing with acetone.

11. The method according to claim 10, further comprising the steps of:
    providing a photosensitive organic-titanium film and a mask, wherein the mask has a pattern of interest;
    applying the mask to the photosensitive organic-titanium film; and
    exposing the photosensitive organic-titania film having the mask to photoirradiation to pattern the film, wherein the exposure results in a patterned titania film having a pattern of interest.

12. The method according to claim 10, wherein the silylation is an aminosilylation.

13. The method according to claim 10, wherein the contacting step is performed under substantially continuous motion of the silicate solution, whereby the motion facilitates the deposition of the silica on the surface of the film.

14. A method of producing a patterned silica film, comprising the steps of:
    providing a patterned titania film;
    contacting the titania film with a silicate solution having a pH in the range of about 8 to about 10, whereby silica is absorbed on the surface of the patterned titania film by adherence to the titania on the film thus adopting the pattern of titania on the film;
    removing excess silica from the contacted titania film; and
    derivatizing the silica surface by silylation.

15. A method of producing a patterned silica film, comprising the steps of:
    providing a photosensitive organic-titanium film and a mask, wherein the mask has a pattern of interest;
    applying the mask to the photosensitive organic-titanium film;
    exposing the photosensitive organic-titania film having the mask to photoirradiation to pattern the film;
    removing unexposed organic titanium from the surface of the film, whereby the unexposed organic titania is the titania protected from irradiation due to its positioning underneath the applied mask;
    contacting the patterned titania film with a silicate solution having a pH in the range of about 8 to about 10, whereby silica is absorbed on the surface of the patterned titania film by adherence to the titania on the film thus adopting the pattern of titania on the film; and
    removing excess silica from the contacted titania film.

16. The method according to claim 15, further comprising the step of derivatizing the silica surface by silylation.

17. The method according to claim 16, wherein the silylation is an aminosilylation.

18. The method according to claim 15, wherein the contacting step is performed under substantially continuous motion of the silicate solution, whereby the motion facilitates the deposition of the silica on the surface of the film.

19. The method according to claim 15, wherein the silicate solution comprises about 1.4% to about 2.8% NaOH and about 2.7% to about 5.4% $SiO_2$.

20. The method according to claim 14, wherein the silicate solution comprises about 1.4% to about 2.8% NaOH and about 2.7% to about 5.4% $SiO_2$.

* * * * *